(12) United States Patent
Gao et al.

(10) Patent No.: US 12,531,514 B2
(45) Date of Patent: Jan. 20, 2026

(54) PLL CIRCUIT AND METHOD FOR GENERATING A MODULATED CARRIER SIGNAL

(71) Applicant: Sony Semiconductor Solutions Corporation, Atsugi (JP)

(72) Inventors: Zhong Gao, Delft (NL); Masoud Babaie, Delft (NL); Martin Fritz, Stuttgart (DE); Jingchu He, Delft (NL); Morteza Alavi, Delft (NL); Bogdan Staszewski, Delft (NL)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/832,961

(22) PCT Filed: Jan. 9, 2023

(86) PCT No.: PCT/EP2023/050324
§ 371 (c)(1),
(2) Date: Jul. 25, 2024

(87) PCT Pub. No.: WO2023/147962
PCT Pub. Date: Aug. 10, 2023

(65) Prior Publication Data
US 2025/0112595 A1 Apr. 3, 2025

(30) Foreign Application Priority Data

Feb. 1, 2022 (EP) ..................................... 22154628

(51) Int. Cl.
*H03C 3/09* (2006.01)
*H03L 7/181* (2006.01)

(52) U.S. Cl.
CPC ........... *H03C 3/095* (2013.01); *H03C 3/0941* (2013.01); *H03C 3/0958* (2013.01); *H03L 7/181* (2013.01); *H03L 2207/50* (2013.01)

(58) Field of Classification Search
CPC .... H03C 3/0941; H03C 3/095; H03C 3/0958; H03L 7/181; H03L 7/1976; H03L 2207/50
(Continued)

(56) References Cited

U.S. PATENT DOCUMENTS 10,236,894 B2   3/2019   van den Heuvel et al.
2009/0052508 A1*  2/2009   Takahashi ............... H03L 7/085
                                                            327/159
(Continued)

FOREIGN PATENT DOCUMENTS

EP    3035535 A1   6/2016

OTHER PUBLICATIONS

International Search Report and Written Opinion mailed on Apr. 17, 2023, received for PCT Application PCT/EP2023/050324, filed on Jan. 9, 2023, 10 pages.
(Continued)

*Primary Examiner* — Levi Gannon
(74) *Attorney, Agent, or Firm* — XSENSUS LLP

(57) ABSTRACT

A PLL circuit for generating a modulated carrier signal includes a digitally controlled oscillator (DCO) to generate the modulated signal. The PLL circuit receives a desired phase change as a modulation signal at each cycle of a non-uniform clock, derived from the a DCO output and a uniform reference clock. This phase change adjusts the DCO's frequency. The circuit also receives a frequency control word, representing the ratio of the desired carrier frequency to the reference clock frequency. The phase change and frequency control word are accumulated to
(Continued)

predict the DCO's output phase. A non-uniform clock compensation circuit calculates a compensation value for the phase change. A phase detector estimates the error between the predicted phase and the time offset between the reference clock and DCO output, generating a control signal for the DCO based on this error.

14 Claims, 9 Drawing Sheets

(58) Field of Classification Search
  USPC .................................................. 332/127, 128
  See application file for complete search history.

(56) References Cited

U.S. PATENT DOCUMENTS

2017/0214408 A1* 7/2017 Liang ...................... H03L 7/099
2017/0366192 A1* 12/2017 Möehlmann ............ H03L 7/095

OTHER PUBLICATIONS

Liu et al., "An Ultra-Low Power 1.7-2.7 GHz Fractional-N Sub-Sampling Digital Frequency Synthesizer and Modulator for IoT Applications in 40 nm CMOS", IEEE Transactions on Circuits and System-1: Regular Papers, vol. 64, No. 5, May 2017, pp. 1094-1105.

Marzin et al., "A 20 Mb/s Phase Modulator Based on a 3.6 GHz Digital PLL With −36 dB EVM at 5 mW Power", IEEE Journal of Solid-State Circuits, vol. 47, No. 12, Dec. 2012, pp. 2974-2988.

* cited by examiner

PLL CIRCUIT AND METHOD FOR GENERATING A MODULATED CARRIER SIGNAL

CROSS-REFERENCE TO RELATED APPLICATIONS

The present disclosure is based on PCT filing PCT/EP2023/050324, filed Jan. 9, 2023, which claims priority from European Patent Application No. 22154628.6, filed Feb. 1, 2022, the entire contents of each are incorporated herein by reference.

FIELD

The present disclosure generally relates to phase locked loop (PLL) circuits, and, more particularly, to circuits and methods for compensating phase errors in two-point modulated PLLs.

BACKGROUND

An increasing demand for wideband mobile wireless services mandates new architectures and solutions for low-cost radio-frequency transceivers. Digital polar transmitters (TXs) entail an advantage of eliminating power-consuming blocks as digital-to-analog converters (DACs), filters and mixers typical of conventional quadrature transmitters and of allowing the use of high-efficiency digitally controlled power amplifiers.

A two-point signal-injection scheme (also known as two-point modulation) may overcome bandwidth limitations of PLLs and allow a wideband frequency or phase modulation of frequency synthesizers. In in two-point modulated PLLs, the modulation signal (for example, phase or frequency) may be sent to both a controlled oscillator's modulation input as well as a PLL master oscillator. Examples of a controlled oscillator include Voltage Controlled Oscillators (VCOs), Digitally Controlled Oscillators (DCOs) or Numerically Controlled Oscillators (NCOs).

An impairment arising in two-point modulation schemes at modulation bandwidths is represented by a delay spread between the two points of injection. This may significantly degrade the error vector magnitude (EVM) and may increase the out-of-band emission.

Thus, it is an object of the present disclosure to provide methods and circuits for improved EVM in two-point modulated PLLs.

SUMMARY

According to a first aspect of the present disclosure, it is provided a PLL circuit for generating a modulated carrier signal. The PLL circuit comprises a controlled oscillator configured to generate a controlled oscillator output signal as the modulated carrier signal. A first input of the PLL circuit is configured to receive a desired phase change as a modulation signal at an n-th cycle of a non-uniform clock derived from the controlled oscillator output signal and a uniform reference clock. The PLL circuit comprises a first path (direct modulation path) for the desired phase change to the controlled oscillator to change its oscillation frequency based on the desired phase change. A second input of the PLL circuit is configured to receive a frequency control word (FCW) at the n-th cycle of the non-uniform clock. The FCW denotes a ratio of a desired carrier frequency of the modulated carrier signal and a frequency of the uniform reference clock. The PLL circuit comprises a second path (phase prediction path) for the desired phase change to a frequency control word accumulator configured to accumulate the desired phase change and the FCW to generate a first phase prediction of the controlled oscillator's output phase for the (n+1)-th cycle of the non-uniform clock. The PLL circuit comprises a non-uniform clock compensation circuit configured to recursively calculate, using the desired phase change, the frequency control word FCW and the first phase prediction, a non-uniform clock compensation value for the desired phase change on the first path and/or a second phase prediction of the controlled oscillator's output phase for the (n+1)-th cycle of the uniform reference clock. A phase detector of the PLL circuit is configured to estimate an error between the second phase prediction and an instantaneous time offset between the uniform reference clock and the controlled oscillator output signal and to generate a control signal for the controlled oscillator based on the estimated error.

According to a second aspect, it is provided a method for generating a modulated carrier signal. The method includes providing a controlled oscillator configured to generate a controlled oscillator output signal as the modulated carrier signal. The method includes receiving a desired phase change as a modulation signal at an n-th cycle of a non-uniform clock derived from the controlled oscillator output signal and a uniform reference clock. The desired phase change is provided to the controlled oscillator to change its oscillation frequency based on the desired phase change. The method includes receiving a frequency control word (FCW) at the n-th cycle of the non-uniform clock, wherein the FCW is a ratio of a desired carrier frequency of the modulated carrier signal and a frequency of the uniform reference clock. The method includes providing FCW and the desired phase change to a frequency control word accumulator configured to accumulate the desired phase change and the FCW to generate a first phase prediction of the controlled oscillator's output phase for the (n+1)-th cycle of the non-uniform clock. The method includes recursively calculating, using the desired phase change, the FCW, and the first phase prediction, a non-uniform clock compensation value for the desired phase change on the first path and/or a second phase prediction of the controlled oscillator's output phase for the (n+1)-th cycle of the uniform reference clock. The method includes estimating an error between the second phase prediction and an instantaneous time offset between the uniform reference clock and the controlled oscillator output signal and generating a control signal for the controlled oscillator based on the estimated error.

The present disclosure presents a concept to compensate phase errors in two-point modulated PLLs, caused by a non-uniform digital processing clock. For the direct modulation path, it may correct phase modulation errors due to a time-varying phase accumulation time in the controlled oscillator. For the phase prediction path, it may correct a phase prediction error due to a variable offset between the uniform reference clock and the non-uniform digital processing clock. Finally, the present disclosure may help the PLL-based phase modulator to break the EVM barrier around $$120\log_{10}\left(\frac{1}{FCW}\right).$$

BRIEF DESCRIPTION OF THE FIGURES

Some examples of apparatuses and/or methods will be described in the following by way of example only, and with reference to the accompanying figures, in which.

DETAILED DESCRIPTION

Figure 1:
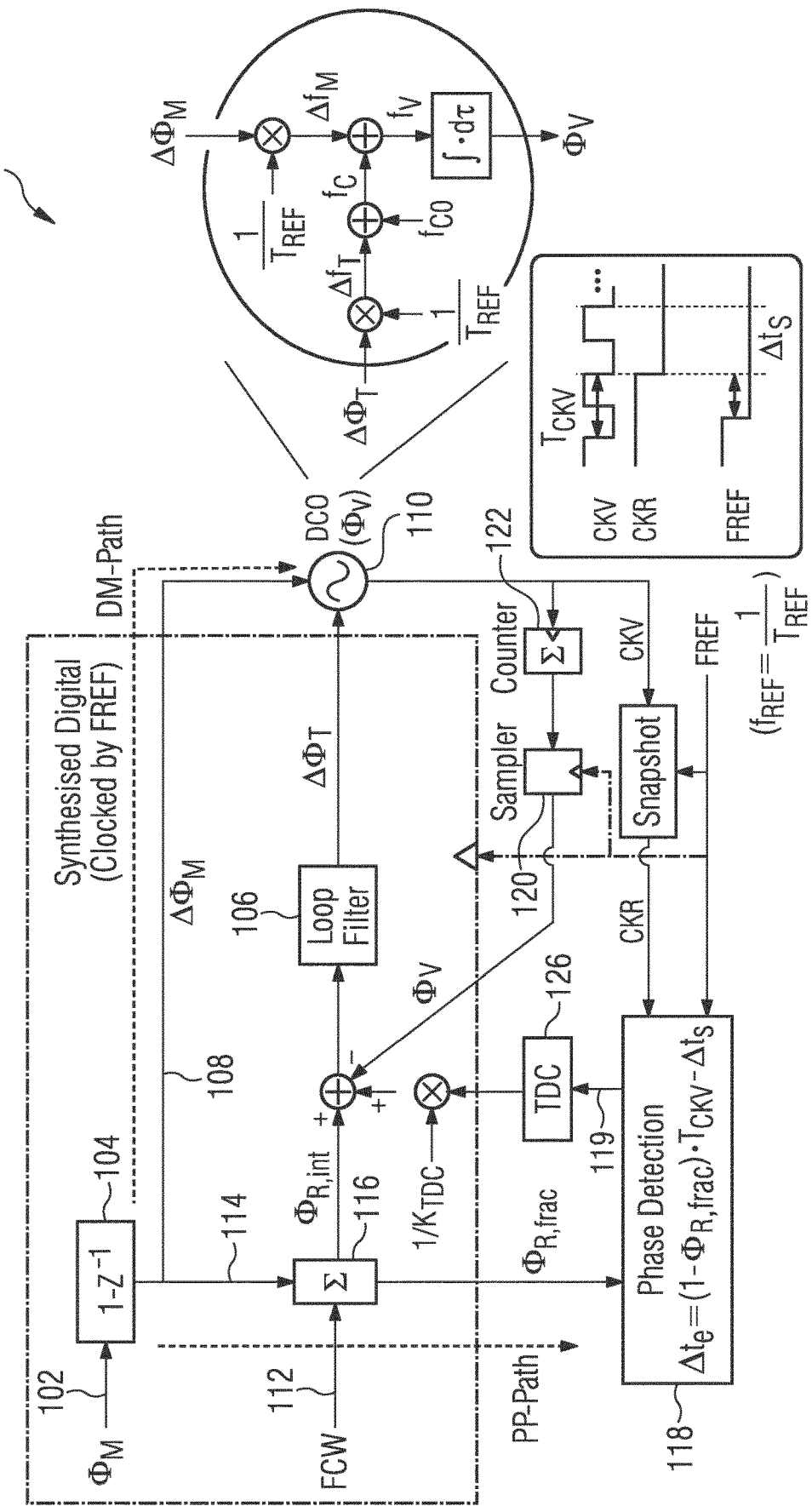
FIG. 1 shows an example of a PLL system where digital part is clocked by FREF.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e., only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Two-point modulation may be used in PLL-based phase or frequency modulators to avoid that the PLL tracks the phase modulation (PM) or frequency modulation (FM). An example for such a system and its timing diagram are shown in FIG. 1 and FIG. 2, respectively.

Figure 2:
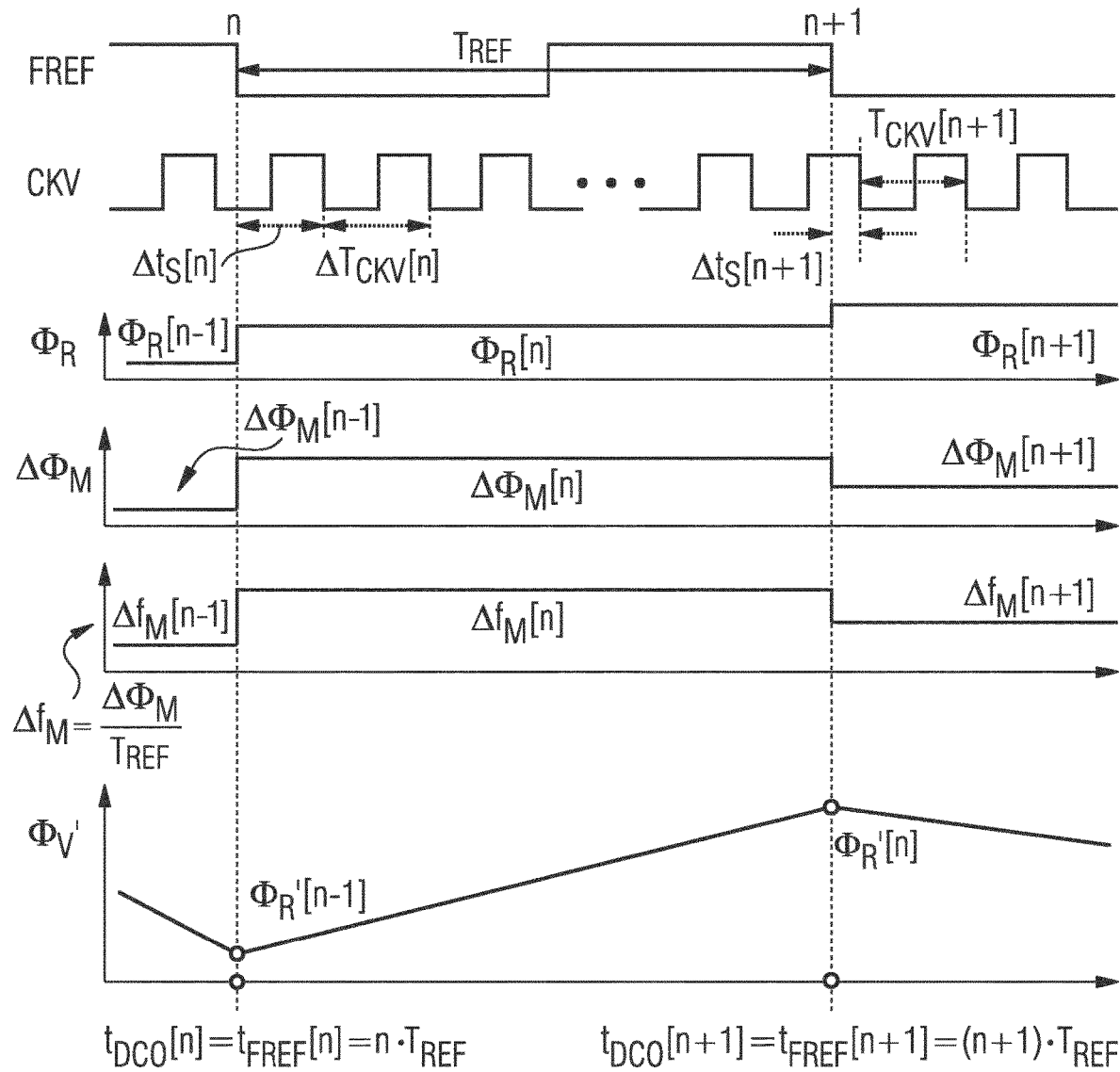
FIG. 2 shows a timing-diagram of the PLL-based phase modulator shown in FIG. 1.

FIG. 1 shows an example of a phase modulated PLL system 100.

PLL system 100 comprises a first input 102 configured to receive, at each clock cycle of a uniform reference clock FREF, a desired phase $\phi_M$ (all the phases shown in this disclosure may be normalized by $1/2\pi$). The desired phase $\phi M$ may be regarded as modulation signal for modulating an output signal CKV of a DCO (Digital Controlled Oscillator) 110. The uniform reference clock FREF may be a highly stable clock signal derived from a crystal oscillator, for example. In the illustrated example, the desired phase PM is differentiated by an optional differentiator 104 which is coupled to first input 102 to obtain a desired phase change $\Delta\phi_M$ during each clock cycle of the uniform reference clock FREF. The skilled person having benefit from the present disclosure will appreciate that the desired phase change $\Delta\phi_{PM}$ could also directly be fed to first input 102, for example, in case of frequency modulation (FM).

The desired phase change $\Delta\phi_M$ may be applied to the PLL system 100 through two paths. The target of this so called two-point modulation is to cancel the PM within the PLL loop, since the PLL ideally only should track and stabilize a carrier phase. That is, PLL control signal $\Delta\phi_T$ provided by the PLL's loop filter 106 should only reflect an error in $f_{c0}$ denoting an instantaneous DCO frequency and correct it to maintain a pure desired carrier frequency $f_C$.

The illustrated PLL system 100 comprises a first path 108 (direct modulation path) for the desired phase change $\Delta\phi_M$ from first input or differentiator 104 to DCO 110 in order to change the oscillation frequency of DCO 110 based on the desired phase change $\Delta\phi_M$. The skilled person having benefit from the present disclosure will appreciate that DCO 110 could also be implemented as a VCO or NCO, for example. The first path 108, the DM-path (direct modulation path), is fed to the DCO 110. In response to the desired phase change $\Delta\phi_M$, the DCO 110 changes its oscillation frequency by $\Delta f_M$ and accumulates a phase change $\Delta\phi_M$ in an output phase $\phi_V$ of the DCO $$\phi_V(t) = \int_0^t f_V(t)d\tau = \int_0^t [f_C + \Delta f_M(t)]d\tau. \qquad \text{Equation 1}$$

The skilled person having benefit from the present disclosure will appreciate that Equation 1 is related to an ideal DCO without any phase noise. That is, only intended signals are present. PLL system 100 comprises a second input 112 configured to receive a frequency control word (FCW) during each clock cycle of the uniform reference clock FREF of PLL system 100. FCW is a ratio of the desired carrier frequency $f_C$ of the carrier signal and a frequency $f_{REF}$ of the uniform reference clock. By ignoring an analog circuit delay between $\Delta f_M$ settling and $\Delta\phi_M$ updating $$\left(\text{i.e. } \Delta f_M[t] = \frac{\Delta\phi_M[t]}{T_{REF}}\right),$$

Equation 1 can be simplified to $$\phi_V(t) = \int_0^t \frac{FCW + \Delta\phi_M(t)}{T_{REF}} d\tau, \qquad \text{Equation 2}$$

$$\text{where } FCW = \frac{f_c}{F_{REF}}$$

(Frequency Control Word) is the ratio of $f_C$ and the digital PLL reference clock rate FREF ($f_{REF}$), and $$T_{REF} = \frac{1}{f_{REF}}$$

is the period of FREF. In the example shown in FIG. 1 and FIG. 2, the synthesized digital clock is FREF. Therefore, at the n-th falling edge of FREF, Equation 2 reaches the expected phase value $$\phi_V[n] = \sum_{i=1}^{n-1}\{\Delta\phi_M[i]\} + (n-1)\cdot FCW = \phi_R[n-1]. \qquad \text{Equation 3}$$

A second path 114 for the desired phase change $\Delta\phi_M$, the PP-path (phase prediction path), may be fed to a FCW accumulator 116, which may accumulate FCW and $\Delta\phi_M$. The accumulated phase $\phi_R[n]=\Sigma_{i=1}^{n}\{\Delta\phi_M[i]+FCW\}=\Sigma_{i=1}^{n}\{\Delta\phi_M[i]\}+n\cdot FCW$ for the n-th FREF cycle ideally should predict the DCO's output phase at the beginning of the next (n+1) FREF cycle ($\phi_V[n+1]$). Thus, the FCW accumulator 116 is configured to accumulate the desired phase change $\Delta\phi_M$ and the FCW to generate a phase prediction $\phi_R[n]$ of the DCO's output phase at the beginning of the next (n+1) FREF cycle.

In FIG. 2, it can be seen that of $\phi'_V[n]$ always reaches the value $\phi'_R[n-1]$ at the n-th FREF edge, i.e., the predicted phase $\phi'_R$ and accumulated DCO output phase $\phi'_V$ of are matching. The extra primes on the variables indicate that the influence of the carrier $f_C$ has been excluded compared to their original counterparts, i.e., $$\phi'_V(t) = \phi_V - f_C \cdot t = \int_0^t \frac{\Delta\phi_M(\tau)}{T_{REF}}d\tau \text{ and}$$

$$\phi'_R[n] = \phi_R[n] - n\cdot FCW = \sum_{i=1}^{n}\{\Delta\phi_M[i]\}.$$

As can be seen from FIG. 1, phase prediction $\phi_R$ may be split into an integer and a fractional part. The integer part $\phi_{R,int}$ may only be used during initial frequency locking phase to lock-on to the desired carrier frequency $f_C$. The fractional part $\phi_{R,frac}$ of phase prediction $\phi_R$ may be used to track the carrier phase $\phi_V$ when the PLL operates in a locked state. This split in $\phi_{R,int}$ and $\phi_{R,frac}$ is optional, but is usually beneficial for PLL architectures, since the integer part can be switched off, as soon as the PLL has achieved frequency lock.

The fractional part $\phi_{R,frac}$ is coupled to a phase detector 118 of PLL circuit 100 which is configured to estimate a phase error by comparing the expected/predicted fractional phase $\phi_{R,frac}$ with an instantaneous time offset $\Delta t_S$ between the uniform reference clock FREF and DCO output signal CKV or signal CKR derived thereof, as can be seen in the timing diagram in FIG. 2. The time offset $\Delta t_S$ can be measured between a falling edge of FREF and the next falling edge of CKV or CKR (which is synchronized with CKV but may have the same average frequency as FREF). A signal $(1-\phi_{R,frac})\cdot T_{CKV}[n]$ (with $T_{CKV}[n]$ denoting the period of CKV during the n-th clock cycle) may be compared to $\Delta t_S$ in order to obtain the error signal (phase error) $\Delta t_e[n]=(1-\phi_{R,frac}[n-1])\cdot T_{CKV}[n]-\Delta t_S[n]$. The error signal $\Delta t_e[n]$ (of phase detector 118 may be provided to loop filter 106 via time-to-digital converter (TDC) 126. An output signal $\Delta\phi_T$ of loop filter 106 is then fed back as control signal to DCO 110.

In accordance with the principle of PLLs, if only FCW without any PM is fed to the DCO, DCO 110 generates a periodic DCO output signal CKV, and the phase detector 118 compares the phase $\phi_V$ of that signal with the phase prediction $\phi_R$, adjusting the DCO 110 to keep the phases matched.

If some PM is only present in DCO output signal CKV through the DM-path 108, this would cause some "virtual phase error" in the phase detection. However, since the same PM is also fed to the PLL via the PP-path 114, the PM is ideally fully cancelled, i.e., only a carrier phase error is tracked within the PLL.

So far, the PLL-based phase modulator discussion was based on an ideal assumption that the synthesized digital part works with a uniform clock FREF. Here, uniform clock refers to a clock where each clock cycle has the same duration without jitter. However, in practice this assumption of uniform clock is not true, since most digital intensive PLLs preferably use a non-uniform digital reference clock which is phase-aligned with the DCO output signal CKV. Non-uniform clock refers to a clock where different clock cycles may have different durations.

A non-uniform digital reference clock which is phase-aligned with the DCO output signal CKV benefits the system in three aspects. First, it may help to minimize the disturbance of the DCO 110 while updating its $\Delta f_T$ and $\Delta f_M$. The main sources of DCO disturbance in case the uniform reference clock FREF is not phase aligned with CKV are due increased instantaneous phase errors at the update time of the DCO inputs (which then are integrated on the DCO output). Secondly, it may protect $\Delta t_S$ sampling in phase detector 118 from disturbance due to updating $\Delta f_M$. As shown in FIG. 2, if FREF is used as the digital clock, $\Delta f_M$ is updated at the exact beginning of $\Delta t_S$ sampling. However, due to analog delay, $\Delta f_M$ update cannot propagate instantaneously. This distorts the sampled $\Delta t_S$, and finally introduces undesired errors in the PLL loop. Third, it may avoid metastability issues in certain digital blocks, for instance sampler 120 in FIG. 1, which is clocked by uniform reference clock FREF but samples an output of counter/accumulator 122 from non-uniform CKV clock domain.

Figure 3:
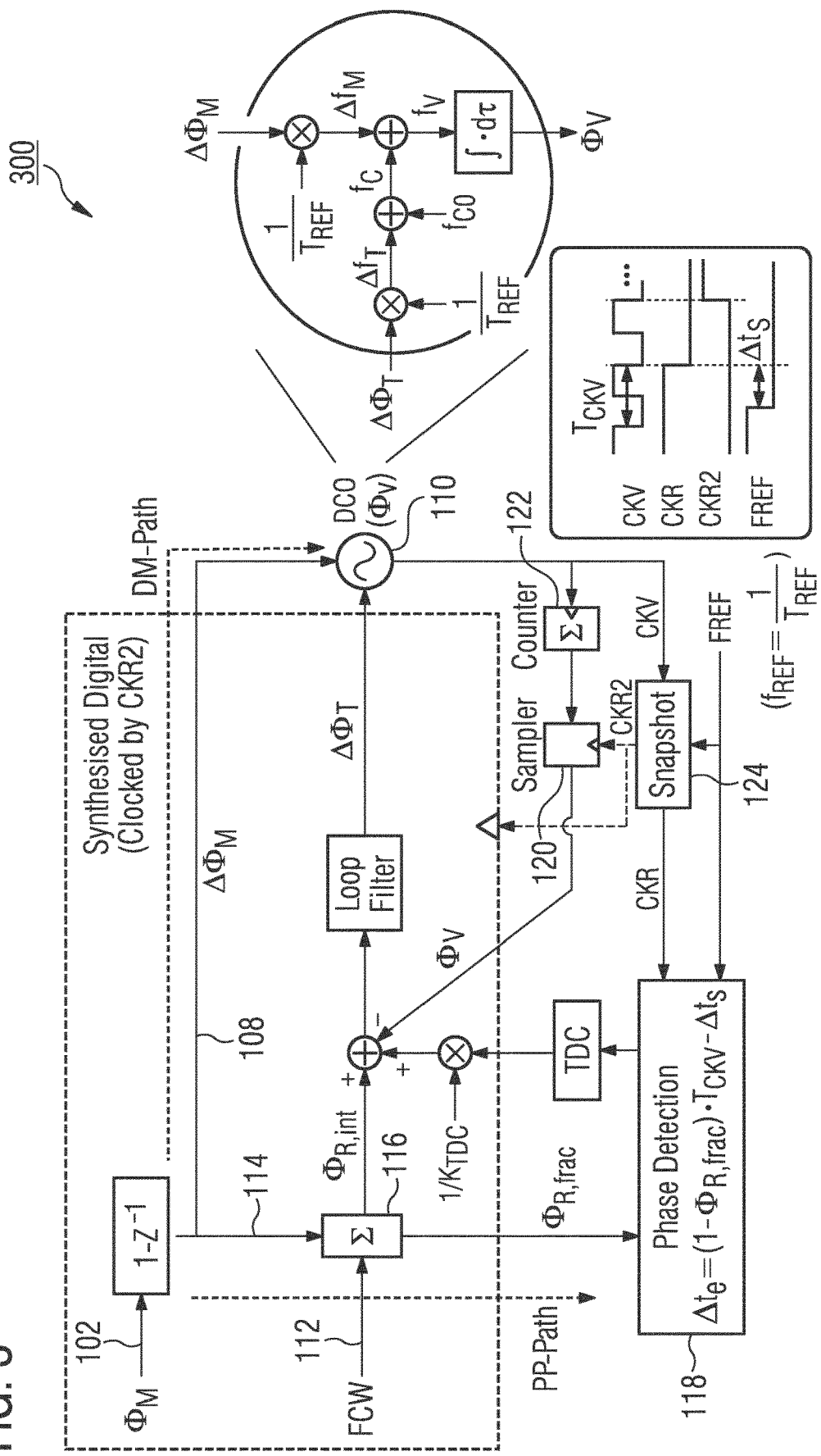
FIG. 3 shows an example of a PLL system where digital part is clocked by CKR2.
Figure 3A:
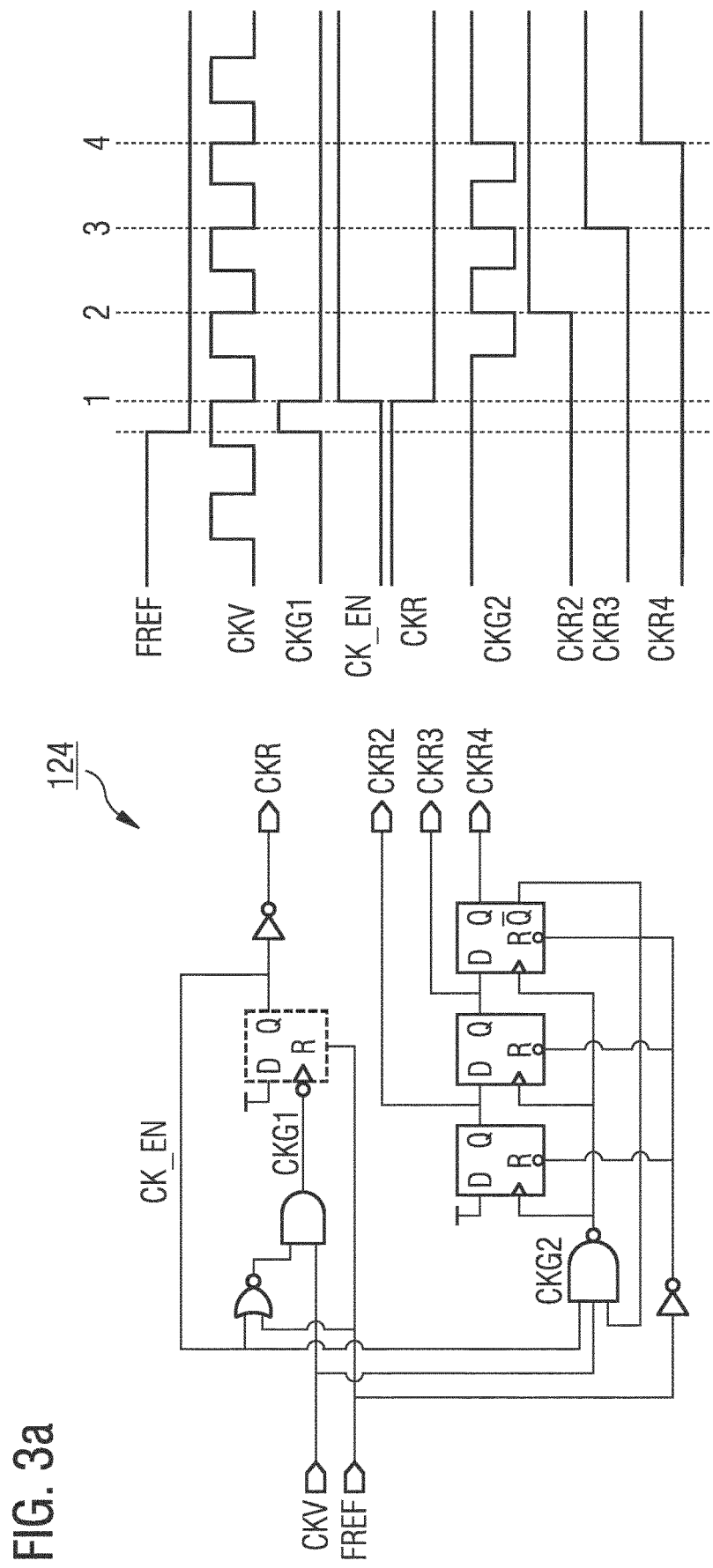
FIG. 3a shows an example circuit of generating CKR2 based on FREF and CKV.

FIG. 3 shows another example of a PLL system 300 where first input 102 and second input 112 are clocked by a non-uniform clock CKR2 which may be generated by snapshot circuit 124 based on the DCO output signal CKV and the uniform reference clock FREF. In contrast, in PLL system 100 of FIG. 1, the first input 102 and second input 112 are both clocked by uniform reference clock FREF. An example of snapshot circuit 124 is depicted in FIG. 3a. The non-uniform clock CKR2 may be generated based on the DCO output signal CKV and the uniform reference clock FREF using a logic circuit comprising various gates and flipflops implementing a frequency divider circuit. As can be seen, the DCO output signal CKV and the uniform reference clock FREF have different respective frequencies and are asynchronous with respect to each other. A frequency of the DCO output signal CKV essentially corresponds to the phase modulated carrier frequency, while a frequency of the uniform reference clock FREF may be substantially lower and highly stable. The non-uniform clock CKR2 and the uniform reference clock FREF have equal respective average frequencies, however, instantaneous periods and start points of the non-uniform clock CKR2 relative to the uniform reference clock FREF do vary from cycle to cycle. In the illustrated example, a rising edge of non-uniform clock CKR2 is phase-aligned with the second falling edge of CKV after the falling edge of FREF. The skilled person having benefit from the present disclosure will appreciate that falling edges may also be rising edges and vice versa in different embodiments.

Figure 4:
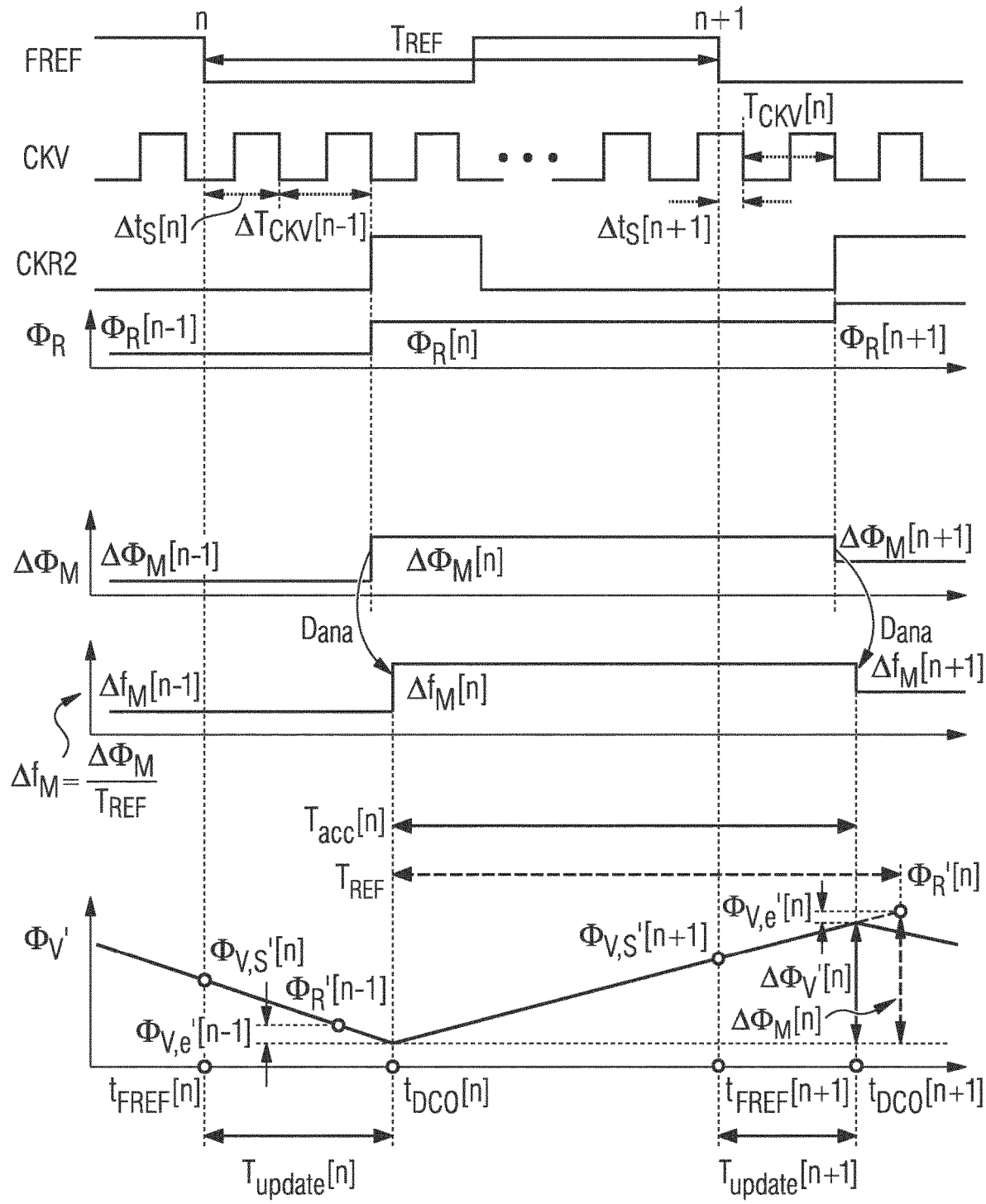
FIG. 4 shows a timing diagram of the PLL-based phase modulator shown in FIG. 3.

As described above, the digital non-uniform clock CKR2 may be phase-aligned with the second CKV falling edge after the falling FREF edge (see FIG. 3a, 4). CKR2 may be generated by snapshot circuit 124 which may be used to generate a digital clock aligned with certain CKV edges after the falling edge of FREF. The naming convention in this disclosure is as follows: non-uniform clock CKR is aligned with the first CKV falling edge after uniform reference clock FREF. CKRN is aligned with the N-th CKV falling edge after the falling edge of uniform reference clock FREF. The (average) frequency of non-uniform clock CKR2 (and CKRN) is still the same as of uniform reference clock FREF, but the instantaneous period and start point of non-uniform clock CKR2 (relative to uniform reference clock FREF) vary from cycle to cycle, depending on the DCO output signal CKV. This could result in significant error in the final DCO output phase $\phi_V$.

The error due to the non-uniform clock CKR2 is analyzed in FIG. 4. Non-uniform clock CKR2 introduces errors to the two paths 108, 114 of the phase modulator in different ways. Firstly, for the DM-path 108, the source of error lies in a variable accumulation time $T_{acc}[n]$ of the n-th cycle of non-uniform clock CKR2, during which the DCO 110 accumulates a constant frequency offset $\Delta f_M[n]$ to the desired phase change $\Delta \phi_M[n]$ of the n-th cycle of non-uniform clock CKR2. Under the uniform clock assumption, $T_{acc}[n]=T_{REF}$, the corresponding frequency change of the DCO 110 should be $$\Delta f_M[n] = \frac{\Delta \phi_M[n]}{T_{REF}}. \qquad \text{Equation 4}$$

This means that the desired phase change of $\Delta \phi_M[n]$ on oy can only be achieved if $\Delta f_M[n]$ is fed to the DCO 110 for exactly the duration of $T_{REF}$. However, in general this is not the case as $\Delta f_M$ is updated with non-uniform clock CKR2 in the circuit of FIG. 3. Considering a time offset between non-uniform clock CKR2 and $\Delta f_M$ update, $D_{ana}$ (propagation delay of control circuit and DCO response time), is almost a constant, $T_{acc}$ is equal to the period of non-uniform clock CKR2, which may vary from cycle to cycle. During the n-th $\Delta f_M$ update cycle, from $t_{DCO}[n]$ to $t_{DCO}[n+1]$, the phase modulation (PM) accumulated on the DCO 110 may be expressed as $$\Delta \phi'_V[n] = \Delta f_M[n] \cdot T_{acc}[n]. \qquad \text{Equation 5}$$

An error relative to the desired phase $\Delta \phi_M[n]$ may be expressed as $$\Delta \phi'_{V,e}[n] = \Delta \phi'_V[n] - \Delta \phi_M[n]. \qquad \text{Equation 6}$$

With Equation 4 and Equation 5, Equation 6 can be re-written as $$\Delta \phi'_{V,e}[n] = \frac{\Delta \phi_M[n]}{T_{REF}} \cdot T_{acc}[n] - \Delta \phi_M[n] = -\frac{T_{REF} - T_{acc}[n]}{T_{REF}} \cdot \Delta \phi_M[n]. \qquad \text{Equation 7}$$

$\Delta \phi'_{V,e}[n]$ is just the error of a single clock cycle. Considering the DCO 110 is a phase accumulator, all errors of all cycles may add up, i.e., at the moment $t=t_{DCO}[n]$, the overall accumulated PM may be expressed as $$\phi'_V(t_{DCO}[n]) = \sum_{i=1}^{n-1}\{\Delta\phi_M[i]\} + \sum_{i=1}^{n-1}\{\Delta\phi'_{V,e}[i]\} = \phi'_R[n-1] + \sum_{i=1}^{n-1}\{\Delta\phi'_{V,e}[i]\}. \qquad \text{Equation 8}$$

The term $\Sigma_{i=1}^{n-1}\{\Delta\phi'_{V,e}[i]\}$ indicates an error accumulation over time. Although the PLL limits such an error accumulation by correcting it via DCO tuning signal $\Delta\phi_T$, this is usually a slow process compared to the data rate of the phase modulator 116. Thus, the error will never be fully compensated by the PLL illustrated in FIG. 3.

Secondly, for the PP-path 114, a source of error lies in the misalignment between uniform reference clock FREF falling edge (at $t_{FREF}[n]$) and the update of $\Delta f_M$ (at $t_{DCO}[n]$). In the ideal case (FIG. 2), $t_{DCO}[n]=t_{FREF}[n]$, which means that with phase prediction $\phi_R[n-1]$ it's possible to precisely predict the time difference between FREF falling (or rising) edge and CKV falling (or rising) edge $\Delta t_S[n]$ (sampled at the falling edge of FREF), in order to detect the phase error in phase detector 118

$$\Delta t_e[n] = (1 - \phi_{R,frac}[n-1]) \cdot T_{CKV}[n] - \Delta t_S[n]. \qquad \text{Equation 9}$$

However, in a realistic case, $t_{DCO}[n]$ and $t_{FREF}[n]$ may be significantly different. As indicated by Equation 8, the predicted phase $\phi'_R[n-1]$ is achieved around $t_{DCO}[n]$ thus, $\phi'_R[n-1]$ (or $\phi_R[n-1]$) is not an accurate prediction of $\phi'_V(t_{FREF}[n])$ (or $\phi_V(t_{FREF}[n])$) any more.

Therefore, a more accurate prediction of the of the DCO's output phase $\phi_{V,S}[n]$ (or $\phi'_{V,S}$ in FIG. 4) is desired. Its fractional part $\phi_{V,S,frac}$ may then be used to detect the phase error $$\Delta t_e[n] = (1 - \phi_{V,S,frac}[n]) \cdot T_{CKV}[n-1] - \Delta t_S[n]. \qquad \text{Equation 10}$$

For example, a constant delay between the DCO's sampled output phase $\phi_{V,S}$ and phase prediction $\phi_R$ could be assumed to interpolate $\phi_{V,S}$. However, this assumption is not exact and can only achieve a sub-optimal estimation. The reasons are two-fold. Firstly, as indicated by Equation 8, phase prediction $\phi_R[n-1]$ (for the beginning of n-th cycle) cannot be achieved exactly at $t_{DCO}[n]$ due to the accumulative error term. Hence, the delay between the DCO's sampled output phase $\phi_{V,S}$ and phase prediction $\phi_R$ is time-variant and (modulation) data dependent. Therefore, it may be important to consider the time-varying nature of the error to properly compensate it. Secondly, even if the error is so well compensated that $\phi_R[n-1]$ is achieved exactly at $t_{DCO}$ [n], the delay between the DCO's sampled output phase $\phi_{V,S}$ and phase prediction $\phi_R$ (as well as the time offset between $t_{FREF}$ and $t_{DCO}$) is not a constant either. As shown in FIG. 4, this delay may be defined as $$T_{update}[n] = \Delta t_S[n] + T_{CKV}[n-1] + D_{ana}, \quad \text{Equation 11}$$

where $\Delta t_S[n]$ is the fractional timing error, $T_{CKV}[n-1]$ the CKV period, and $D_{ana}$ the analog delay due to DCO response time and propagation delay. The $T_{CKV}[n-1]$ and $D_{ana}$ terms are approximately constant, but the $\Delta t_S[n]$ may vary between 0 and $T_{CKV}[n-1]$. Therefore, the constant delay assumption should be abandoned and a better estimation of the DCO's sampled output phase $\phi_{V,S}$ should be achieved by correcting the DM-path error and considering the time-varying $T_{update}$.

The Non-Uniform Clock Compensation (NUCC) technique proposed in the present disclosure can suppress an error caused by these two mechanisms and thus improve the EVM of the phase modulator output.

Figure 5:
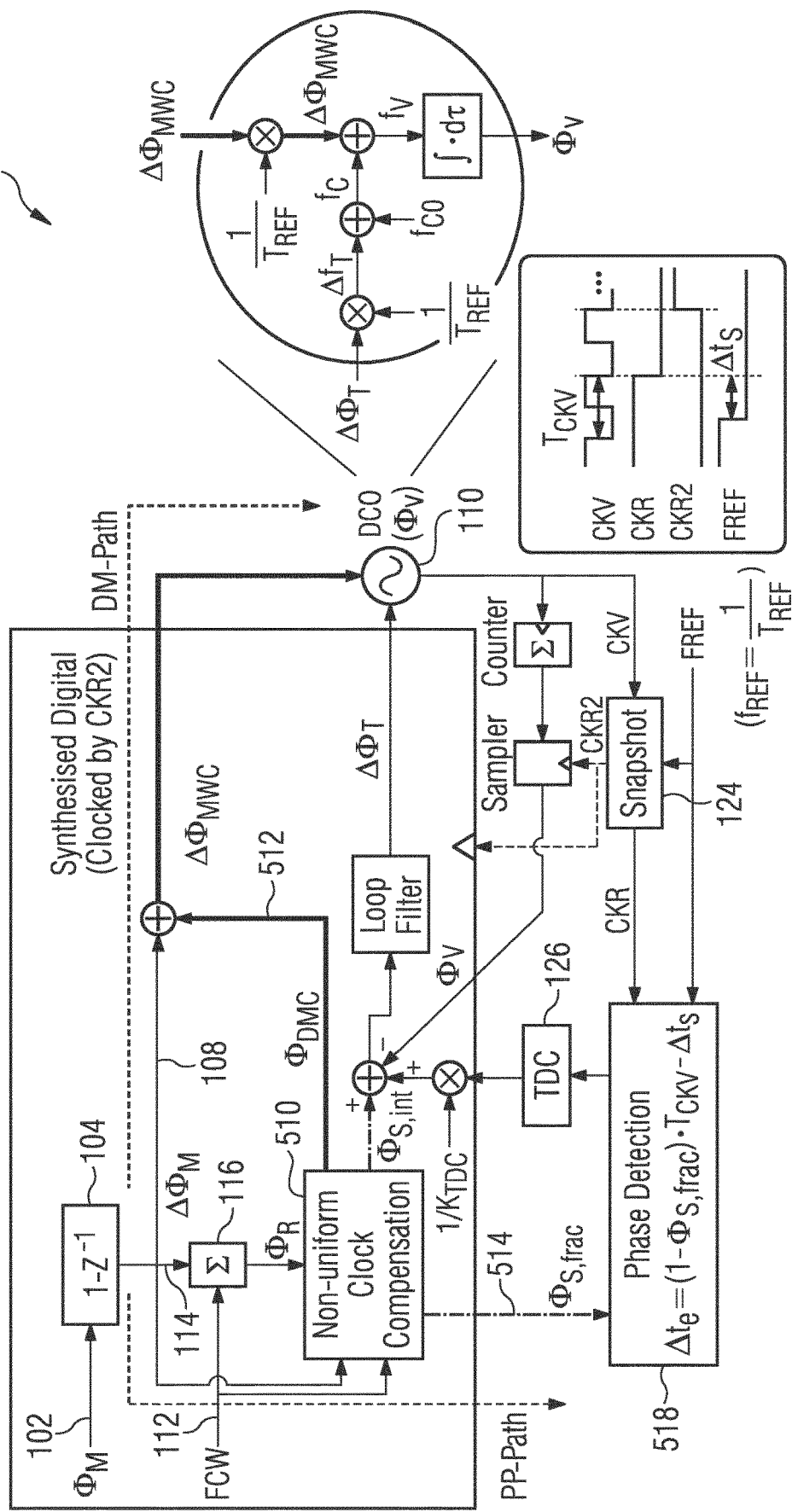
FIG. 5 shows a PLL-based phase modulator with the proposed Non-Uniform Clock Compensation (NUCC)

FIG. 5 illustrates a PLL circuit 500 for generating a modulated carrier signal in accordance with an embodiment of the present disclosure.

PLL circuit 500 comprises DCO 110 configured to generate DCO output signal CKV as the modulated carrier signal. PLL circuit 500 comprises first input 102 configured to receive desired modulation phase $\phi_M[n]$ or desired phase change $\Delta\phi_M[n]$ as a modulation signal at an n-th cycle of non-uniform clock CKR2 derived from the DCO output signal CKV and a uniform reference clock FREF using snapshot circuit 124. Optional differentiator circuitry 104 may be configured to differentiate the desired modulation phase $\phi_M[n]$ to generate the desired phase change $\Delta\phi_M[n]$ at the n-th cycle of the non-uniform clock CKR2. PLL circuit 500 comprises the first DM path 108 for the desired phase change $\Delta\phi_M[n]$ to the DCO 110 to change its oscillation frequency based on the desired phase change $\Delta\phi_M[n]$.

PLL circuit 500 also comprises second input 112 configured to receive the frequency control word FCW at the n-th cycle of the non-uniform clock CKR2. That is, both inputs 102, 112 of PLL circuit 500 are clocked or updated at non-uniform clock rate of non-uniform clock CKR2.

PLL circuit 500 also comprises the second PP path 114 for the desired phase change $\Delta\phi_M[n]$ to frequency control word accumulator 116 which is configured to accumulate the desired phase change $\Delta\phi_M[n]$ and the FCW to generate a first phase prediction $\phi_R[n]$ of the DCO's output phase at the beginning of the (n+1)-th cycle of the non-uniform clock CKR2.

In contrast to the previous examples, PLL circuit 500 comprises a non-uniform clock compensation (NUCC) circuit 510 which is configured to recursively calculate a non-uniform clock compensation value $\phi_{DMC}[n]$ 512 for the desired phase change $\Delta\phi_M[n]$ on the first path 108 and/or a second phase prediction $\phi_S[n]$ 514 of the DCO's output phase at the (n+1)-th cycle of the uniform reference clock FREF. This recursive calculation may be done using the desired phase change $\Delta\phi_M[n]$, the frequency control word FCW, and the first phase prediction $\phi_R[n]$ of frequency control word accumulator 116.

PLL circuit 500 comprises phase detector 518 configured to estimate an error $\Delta t_e[n]$ between (fractional part of) second phase prediction $\phi_S[n]$ and an instantaneous time offset $\Delta t_S$ between the uniform reference clock FREF and the DCO output signal CKV (or CKR) and to generate a control signal for the DCO 110 based on the estimated error. The error $\Delta t_e[n]$ may be determined according to $\Delta t_e[n]=(1-\phi_{S,frac})\cdot T_{CKV}-\Delta t_S$. Thus, if $\phi_{S,frac}=1$, the error would be $\Delta t_e=-\Delta t_S$. If $\phi_{S,frac}=0$, the error would be $\Delta t_e=T_{CKV}-\Delta t_S$. The error $\Delta t_e[n]$ may be fed to time-to-digital converter (TDC) 126. Output of TDC 126 may be multiplied by a constant $1/K_{TDC}$ and added to an integer part of second phase prediction $\Phi_{S,int}[n]$ (which may be zero in locked state). A sampled phase $\phi_V$ of the DCO output may be subtracted and the result may then be fed to loop filter 128 to obtain PLL control signal $\Delta\Phi_T[n]$ for DCO 110 at the n-th cycle of non-uniform clock CKR2.

As mentioned above, the non-uniform digital clock CKR2 may introduce errors on the phase modulator, mainly by diverging from the expected DCO phase accumulation duration $T_{acc} \neq T_{REF}$ and the time offset between FREF falling edge and CKR2 rising edge, i.e., when $\phi_V$ reaches $\phi_{V,S}$ and $\phi_R$. The basic idea of the proposed NUCC is that these variable parts can be well predicted. Thus, the relevant errors can be compensated.

A key point of the PLL-based phase modulator with NUCC circuit 510 shown in FIG. 5 is the introduction of second phase prediction $\phi_S$ in order to estimate the DCO's output phase $\phi_{V,S}$. $\phi_S$ comprises a fractional part $\phi_{S,frac}$ and an integer part $\phi_{S,int}$, same as the convention of first phase prediction $\phi_R$ in FIG. 1. Here, second phase prediction $\phi_S[n-1]$ at the (n-1)-th cycle of non-uniform clock CKR2 predicts $\phi_{V,S}[n]$ at the (beginning of) n-th cycle of uniform reference clock FREF in FIG. 4 And with $\phi_{S,frac}$, $\Delta t_S$, and consequently the variation of $T_{update}$ and $T_{acc}$ (FIG. 4) can also be well estimated. Then, on the DM-path 108, the estimated $T_{acc}$ may help to estimate the PM error $\phi'_{V,e}$ which may be compensated by non-uniform clock compensation value $\phi_{DMC}$. Because of the error compensation on the DM-path 108, the delay between first phase prediction $\phi_R$ and DCO's output phase $\phi_{V,S}$ can be predicted by $T_{update}$. Then with $T_{update}$ of the previous cycle, the proposed NUCC may give a good estimation of $\phi_{S,frac}$ for the next cycle of non-uniform clock CKR2.

The explanation above indicates that the compensation of the two paths 108, 114 may rely on each other: the DM-path compensation may rely on an accurate prediction of $\Phi_S$ or $\phi_{S,frac}$ of the PP-path 114 to estimate $T_{acc}$ and the PP-path compensation may rely on the DM-path compensation to minimize the DCO's PM error $\phi'_{V,e}$, thus, predicting $\phi_{S,frac}$ more accurately. Therefore, these two compensations may be applied simultaneously to be more effective. However, the NUCC algorithm could also just include of one of the two compensation schemes, at the cost of having a larger residual error, which the PLL needs to compensate.

Direct-Modulation-Path Compensation

Firstly, consider the compensation on the DM-path 108. Equation 7 has already estimated the error to the desired phase $\Delta\phi_M[n]$ accumulated in the DCO 110, so the proposed NUCC just needs to compensate it in the next cycle of non-uniform clock CKR2 with a non-uniform clock compensation value according to $$\phi_{DMC}[n] = -\Delta\phi'_{V,e}[n-1] = \frac{T_{REF} - T_{acc}[n-1]}{T_{REF}} \cdot \Delta\phi_M[n-1]. \quad \text{Equation 12}$$

Thus, the NUCC circuit 510 may be configured to calculate the non-uniform clock compensation value $\phi_{DMC}[n]$ for the n-th non-uniform clock CKR2 cycle based on the desired phase change $\Delta\phi_M[n-1]$ of the (n−1)-th non-uniform clock CKR2 cycle, a non-uniform period $T_{acc}[n-1]$ of the (n−1)-th non-uniform clock CKR2 cycle, and a constant period $T_{REF}$ of the uniform reference clock. While the non-uniform period $T_{acc}[n-1]$ could be measured in some embodiments, the expression $$\frac{T_{REF} - T_{acc}[n-1]}{T_{REF}}$$

and hence $\phi_{DMC}[n]$ may also be estimated using the second phase prediction $\phi_S$ (or the fractional part $\phi_{S,frac}$ thereof).

Non-uniform clock compensation value $\phi_{DMC}[n]$ may be added to the desired phase change $\Delta\phi_M[n]$ and thus impose an extra frequency change $\Delta f_{DMC}[n]$ on top of the original $\Delta f_M[n]$ to achieve the phase change of $\Delta\phi_M$ in each CKR2 cycle. The extra frequency change $\Delta f_{DMC}[n]$ changes the slope of $\phi'_V(t)$ during the n-th cycle of non-uniform clock CKR2, as can be seen when comparing line 604 to original line 602 in FIG. 6. Then, at the end of the n-th cycle ($t_{DCO}[n+1]$), in addition to $\Delta\phi_M[n]$, an extra phase change close to $\phi_{DMC}[n]$ has been integrated on the DCO output. Consequently, the error due to the previous cycle ($\Delta\phi'_{V,e}[n-1]$) is compensated.

In terms of realizing this compensation technique, it may be needed to estimate the coefficient $$C_{DM}[n] = \frac{T_{FREF} - T_{acc}[n]}{T_{FREF}}, \qquad \text{Equation 13}$$

and Equation 12 consequently may be written as $$\phi_{DMC}[n] = C_{DM}[n-1] \cdot \Delta\phi_M[n-1]. \qquad \text{Equation 14}$$

$C_{DM}[n]$ Estimation

Figure 6:
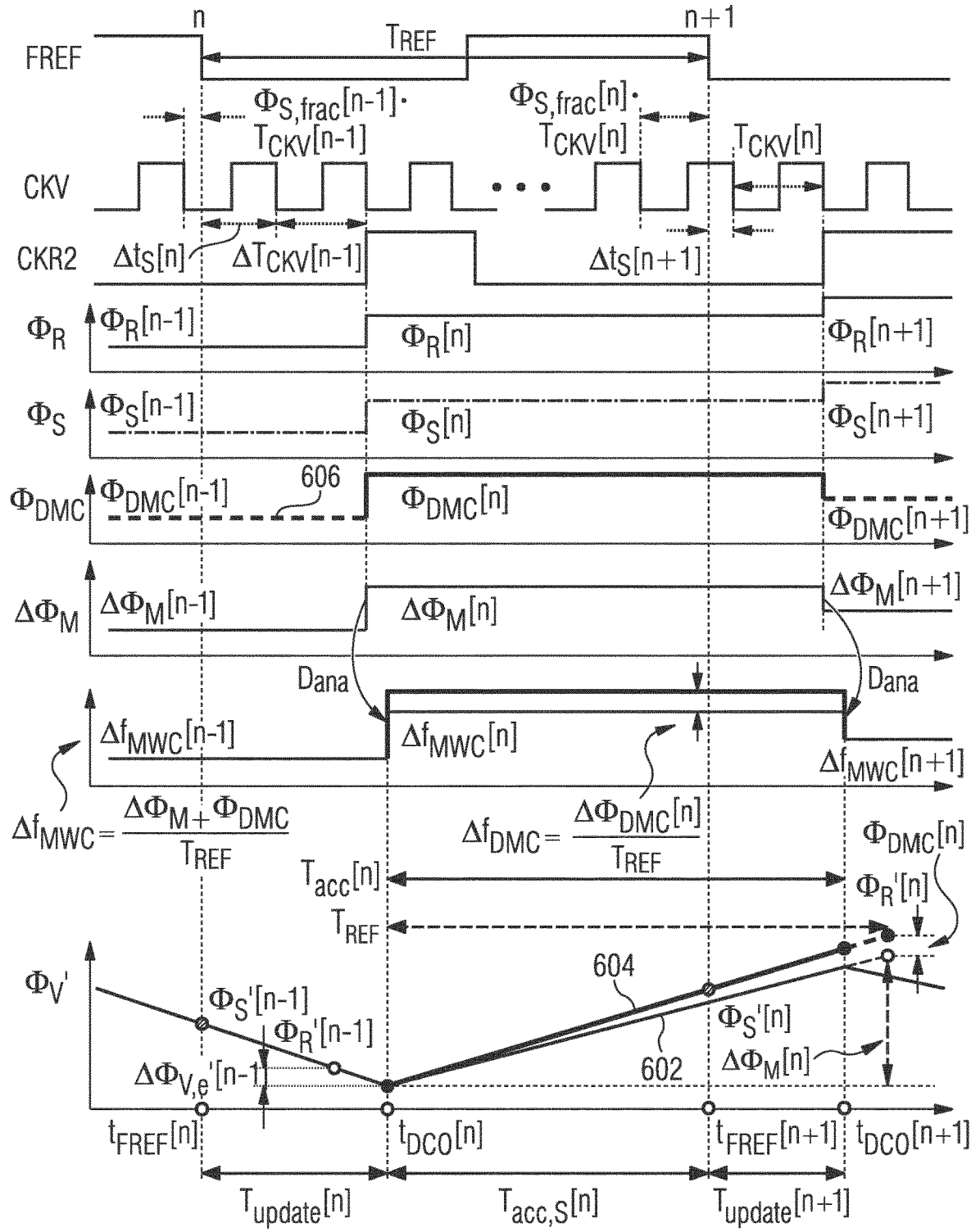
FIG. 6 shows NUCC details for the n-th FREF/CKR2 clock cycle.

According to FIG. 6, the instantaneous period $T_{acc}[n]$ of the n-th non-uniform clock CKR2 cycle is $T_{acc}[n]=T_{REF}-T_{update}[n]+T_{update}[n+1]$. Considering Equation 11 and $\Delta t_S[n]=(1-\phi_{S,frac}[n-1])\cdot T_{CKV}[n-1]$, $C_{DM}[n]$ may be expressed as $$C_{DM}[n] = \qquad \text{Equation 15}$$
$$(2-\phi_{S,frac}[n-1])\frac{T_{CKV}[n-1]}{T_{FREF}} - (2-\phi_{S,frac}[n])\frac{T_{CKV}[n]}{T_{FREF}}.$$

Then according to the frequencies defined in the DCO model of FIG. 5, $$\frac{T_{CKV}[n]}{T_{FREF}} = \frac{f_{REF}}{f_V[n]} = \frac{f_{REF}}{f_C + \Delta f_{MWC}[n]} = \qquad \text{Equation 16}$$
$$\frac{f_{REF}}{FCW \cdot f_{REF} + \Delta\phi_{MWC}[n] \cdot f_{REF}} = \frac{1}{FCW + \Delta\phi_{MWC}[n]} =$$

-continued
$$\frac{1}{FCW + \Delta\phi_M[n] + \phi_{DMC}[n]}.$$

Therefore, the coefficient $C_{DM}[n]$ for estimating the clock compensation value $\phi_{DMC}[n]$ can be estimated as $$C_{DM}[n] = \frac{2-\phi_{S,frac}[n-1]}{FCW + \Delta\phi_M[n-1] + \phi_{DMC}[n-1]} - \qquad \text{Equation 17}$$
$$\frac{2-\phi_{S,frac}[n]}{FCW + \Delta\phi_M[n] + \phi_{DMC}[n]}.$$

Thus, the NUCC circuit 510 may be configured to calculate the coefficient $C_{DM}[n]$ based on:
- the frequency control word FCW,
- the (fractional part of) the second phase prediction $\phi_{S,frac}$ of the (n−1)-th and the n-th cycle of the non-uniform clock CKR2,
- the desired phase change $\Delta\phi_M$ of the (n−1)-th and the n-th cycle of the non-uniform clock CKR2, and
- the non-uniform clock compensation value $\phi_{DMC}$ of the (n−1)-th and the n-th cycle of the non-uniform clock CKR2.

However, this might be too complex to implement in real applications when considering the comparably relaxed EVM requirements in current applications. If the condition $FCW \gg \Delta\phi_M \gg \phi_{DMC}$ is satisfied (which typically is the case), Equation 17 can be simplified to $$C_{DM}[n] \approx \frac{\phi_{S,frac}[n] - \phi_{S,frac}[n-1]}{FCW}. \qquad \text{Equation 18}$$

Thus, the NUCC circuit 510 may be configured to calculate the coefficient $C_{DM}[n]$ based on:
- the frequency control word FCW, and
- the (fractional part of) the second phase prediction $\phi_{S,frac}$ of the (n)-th and the (n−1)-th cycle of the non-uniform clock CKR2.

Together with Equation 14, the NUCC circuit 510 may be configured to calculate the non-uniform clock compensation value $\phi_{DMC}[n]$ for the n-th non-uniform clock CKR2 cycle based on:
- the frequency control word FCW,
- the (fractional part of) the second phase prediction $\phi_{S,frac}$ of the (n−2)-th and the (n−1)-th cycle of the non-uniform clock CKR2; and
- the desired phase change $\Delta\phi_M$ of the (n−1)-th cycle of the non-uniform clock CKR2.

The non-uniform clock compensation circuit may hence be configured to calculate the non-uniform clock compensation value $\phi_{DMC}[n]$ for the n-th non-uniform clock CKR2 cycle based on the second phase prediction $\phi_S[n-2]$ of the DCO's output phase for the n−1-th uniform reference clock FREF cycle, the second phase prediction $\phi_S[n-1]$ of the DCO's output phase for the n-th uniform reference clock FREF cycle, the frequency control word FCW, and the desired phase change $\Delta\phi_M[n-1]$ of the (n−1)-th non-uniform clock CKR2 cycle.

Such an approximation only results in a residual phase error at the DCO output in the order $$\frac{1}{FCW^2}.$$

Extended Direct-Modulation-Path Compensation

One may doubt Equation 12 is not accurate enough because there is also a tiny second order residual error due to the time-variance of $T_{acc}[n]$. The expression $$\Delta f_{DMC}[n] = \frac{\phi_{DMC}[n]}{T_{REF}}$$

indicates that the exact phase compensation $\phi_{DMC}[n]$ can only be achieved if $T_{acc}[n]=T_{REF}$. Due to the variation of $T_{acc}[n]$ there is a residual error, like the DM-path error $\Delta'_{V,e}$. This error has the same form as Equation 7

$$\phi_{DMC,e}[n] = -\frac{T_{REF} - T_{acc}[n]}{T_{REF}} \cdot \Delta\phi_{DMC}[n]. \qquad \text{Equation 19}$$

If this residual error shall be further compensated in the next cycle, a recursive extension of Equation 12 may be advantageous, for an even better estimation of $\phi_{DMC}[n]$ Equation 20

$$\phi_{DMC}[n] = -\Delta\phi'_{V,e}[n-1] - \phi_{DMC,e}[n-1] =$$

$$\frac{T_{REF} - T_{acc}[n-1]}{T_{REF}} \cdot (\Delta\phi_M[n-1] + \phi_{DMC}[n-1]) =$$

$$C_{DM}[n-1] \cdot (\Delta\phi_M[n-1] + \phi_{DMC}[n-1]).$$

The NUCC circuit 510 may hence be configured to calculate the non-uniform clock compensation value $\phi_{DMC}[n]$ for the n-th non-uniform clock CKR2 cycle based on:
- the frequency control word FCW,
- the (fractional part of) the second phase prediction $\phi_{S,frac}$ of the (n−2)-th and the (n−1)-th cycle of the non-uniform clock CKR2,
- the desired phase change $\Delta\phi_M$ of the (n−1)-th cycle of the non-uniform clock CKR2, and
- the non-uniform clock compensation value $\phi_{DMC}[n-1]$ of the (n−1)-th non-uniform clock CKR2 cycle.

Then, depending on the required accuracy, either Equation 17 or Equation 18 can be used to estimate $C_{DM}[n]$. One point to emphasis while using Equation 18 is that the assumption FCW≫$\Delta\phi_M$≫$\phi_{DMC}$ is used for this approximation. This assumption also indicates that the recursive term $\phi_{DMC}[n-1]$ can be ignored here. Consequently, Equation 20 will fall back to the same form of Equation 14, which is $$\phi_{DMC}[n] = \frac{\phi_{S,frac}[n-1] - \phi_{S,frac}[n-2]}{FCW} \cdot \Delta\phi_M[n-1]. \qquad \text{Equation 21}$$

Phase-Prediction-Path Compensation

Furthermore, consider the PP-path compensation. The target of PP-path compensation is to give an accurate estimation of the $\phi_S[n]$, which predicts $\phi_V(t)$ sampled at FREF falling edge, when $t=t_{FREF}[n+1]$. $\phi_S[n]$ may be estimated by interpolating $\phi_R[n]$ which should ideally be reached around $t_{DCO}[n+1]$. However, the uncompensated DM-path error blurs the position of $\phi_R[n]$, thus making it difficult to interpolate $\phi_S[n]$. Luckily, this problem may be solved if we have the DM-path error compensation. With this compensation running in parallel, by the end of the n-th $\Delta f_{MWC}$ update cycle (when $t=t_{DCP}[n+1]$), all the DM-path errors accumulated before this cycle have been eliminated. Thus Equation 8 can be modified to represent the $\phi'_V$ at this moment $$\phi'_V(t_{DCO}[n+1]) = \phi'_R[n] + \Delta\phi'_{V,e}[n]. \qquad \text{Equation 22}$$

The error term $\Delta\phi'_{V,e}[n]$ shows up here because in general $T_{acc}[n] \neq T_{REF}$. Therefore, if we virtually extend $T_{acc}[n]$ to $T_{REF}$, which extrapolates $\phi'_V(t_{DCO}[n+1])$ to $\phi'_V(t_{DCO}[n]+T_{REF})$ with $\Delta f_{MWC}[n]$, the phase of $\phi'_R[n]$ can be achieved exactly (see line 606 and $\phi'_R[n]$ in FIG. 6). Considering the delay between the two moments when $\phi'_V$ reaches $\phi'_S[n]$ and $\phi'_R[n]$ is $T_{REF}-T_{acc,S}[n]=T_{update}[n]$, $\phi'_S[n]$ can be interpolated as $$\phi'_S[n] = \phi'_R[n] - \frac{T_{update}[n]}{T_{REF}} \cdot (\Delta\phi_M[n] + \phi_{DMC}[n]). \qquad \text{Equation 23}$$

Taking the carrier into account, this can be written as $$\phi_S[n] = \phi_R[n] - \frac{T_{update}[n]}{T_{REF}} \cdot (\Delta\phi_M[n] + \phi_{DMC}[n]). \qquad \text{Equation 24}$$

Thus, the NUCC circuit 510 may be configured to calculate the second phase prediction $\phi_S[n]$ of the DCO's output phase for the (n+1)-th uniform reference clock (FREF) cycle based on
- the first phase prediction $\phi_R[n]$ of the DCO's output phase at the (n+1)-th cycle of the non-uniform clock (CKR2),
- the desired phase change $\Delta\phi_M[n]$ at the n-th cycle of a non-uniform clock CKR2,
- the non-uniform clock compensation value $\phi_{DMC}[n]$,
- a period $T_{REF}$ of the uniform reference clock, and
- a non-uniform delay $T_{update}[n]$ between a (falling or rising) edge of the n-th uniform reference clock FREF cycle and a (rising or falling) edge of the (n+1)-th non-uniform clock CKR2 cycle plus an essentially constant analog circuit delay $D_{ana}$. To implement this estimation, the coefficient $$\frac{T_{update}[n]}{T_{REF}}$$

may be estimated. Following the similar scenario as the $C_{DM}$ analysis, $$\frac{T_{update}[n]}{T_{REF}}$$

may be estimated according to $$\frac{T_{update}[n]}{T_{REF}} = \frac{2 - \phi_{S,frac}[n-1]}{FCW + \Delta\phi_M[n-1] + \phi_{DMC}[n-1]} + \frac{D_{ana}}{T_{REF}}. \qquad \text{Equation 25}$$

The NUCC circuit 510 may hence be configured to estimate $$\frac{T_{update}[n]}{T_{REF}}$$

based on:
- the second phase prediction $\phi_{S,frac}[n-1]$ of the DCO's output phase at the beginning of the n-th cycle of the uniform reference clock FREF,
- the desired phase change $\Delta\phi_M$ of the (n−1)-th cycle of the non-uniform clock CKR2;
- the non-uniform clock compensation value $\phi_{DMC}[n-1]$ of the (n−1)-th non-uniform clock CKR2 cycle,
- the FCW, and
- and some essentially constant expression $$\frac{D_{ana}}{T_{REF}}.$$

Substituting Equation 25 into Equation 24 yields

Equation 26

$$\phi_S[n] = \phi_R[n] - \left(\frac{2 - \phi_{S,frac}[n-1]}{FCW + \Delta\phi_M[n-1] + \phi_{DMC}[n-1]} + \frac{D_{ana}}{T_{REF}}\right) \cdot (\Delta\phi_M[n] + \phi_{DMC}[n]).$$

The constant term $$\frac{D_{ana}}{T_{REF}}$$

can be estimated and the remaining variables are well-known from previous explanation. $D_{ana}$ denotes a constant delay between FREF and CKR2. Denote an estimate of $D_{ana}$ on chip as $D_{est}$. If $D_{est}$ is larger or smaller, the $\phi'_S[n]$ will be shifted less or more towards the direction of $\Delta\phi_M[n]$. This deviation can be detected by TDC 126, whose output is $D_{TDC}[n]$. Therefore, $D_{est}$ can be calibrated with a Least Mean Square (LMS) algorithm correlating $\Delta\phi_M[n]$ and $D_{TDC}[n]$. Due to the integration effect of oscillator, actually correlated $\Delta\phi_M[n-1]\cdot(1-z^{-1})$ and $D_{TDC}[n]$. So $D_{est}$ may be $D_{est}=\Sigma\mu\cdot(\Delta\phi_M[n-1]-\Delta\phi_M[n-2])\cdot D_{est}$.

With Equation 26, the second phase prediction $\phi_S$ can be estimated accurately. But the hardware cost may be high due to its complexity. If the condition $FCW\gg\Delta\phi_M\gg\phi_{DMC}$ is satisfied (which typically is the case for a realistic design), Equation 26 can be approximated as $$\phi_S[n] \approx \phi_R[n] - \left[\left(\frac{2}{FCW} + \frac{D_{ana}}{T_{REF}}\right) - \frac{\phi_{S,frac}[n-1]}{FCW}\right]\cdot(\Delta\phi_M[n]).$$ Equation 27

The constant term $$\frac{2}{FCW} + \frac{D_{ana}}{T_{REF}}$$

here can still be estimated with the method described above.

Comparing In Equation 27 to Equation 26, the error of the approximation is in the order of $$\frac{1}{FCW^2}.$$

Since both Equation 26 and Equation 27 have recursive form, one might worry about the value of $\phi_{S,frac}[n-1]$ to be used for $\phi_S[n]$ when n=0. Since a PLL-based phase modulator needs to lock the PLL before applying phase modulation, both $\Delta\phi_M[n]$ and $\phi_{DMC}[n]$ may initially be set to 0. Then both these two equations degenerate to $\phi_S[n]=\phi_R[n]$. In other words, the initial value for $\phi_S[0]$ may be $\phi_{S,frac}[-1]=\phi_{R,frac}[-1]$.

If only Direct-Modulation-Path Compensation (without Phase-Prediction-Path Compensation) is used then the estimation of $\phi_{DMC}$ may use $\phi_{R,frac}$ instead of $\phi_{S,frac}$, i.e.

$$\phi_{DMC}[n] = \frac{\phi_{R,frac}[n-2] - \phi_{R,frac}[n-1]}{FCW}\cdot\Delta\phi_M[n-1].$$

If only Phase-Prediction-Path Compensation (without Direct-Modulation-Path Compensation) is used in the system, one may set $\phi_{DMC}=0$ in the corresponding equation, i.e.

$$\phi_S[n] = \phi_R[n] - \frac{T_{update}[n]}{T_{REF}}\cdot(\Delta\phi_M[n] + 0)$$

The proposed NUCC scheme can significantly improve the EVM of PLL-based phase modulator if it is not dominated by other analogue impairment, e.g., DCO nonlinearity. Unfortunately, DCO intrinsic nonlinearity, due to the inverse square root relationship between its oscillation frequency and variable capacitance, may have more significant influence on the EVM than the non-uniform clock. Therefore, the NUCC may work with some optional DCO nonlinearity digital pre-distortion (DPD) blocks shown in FIGS. 7 and 8.

Figure 7:
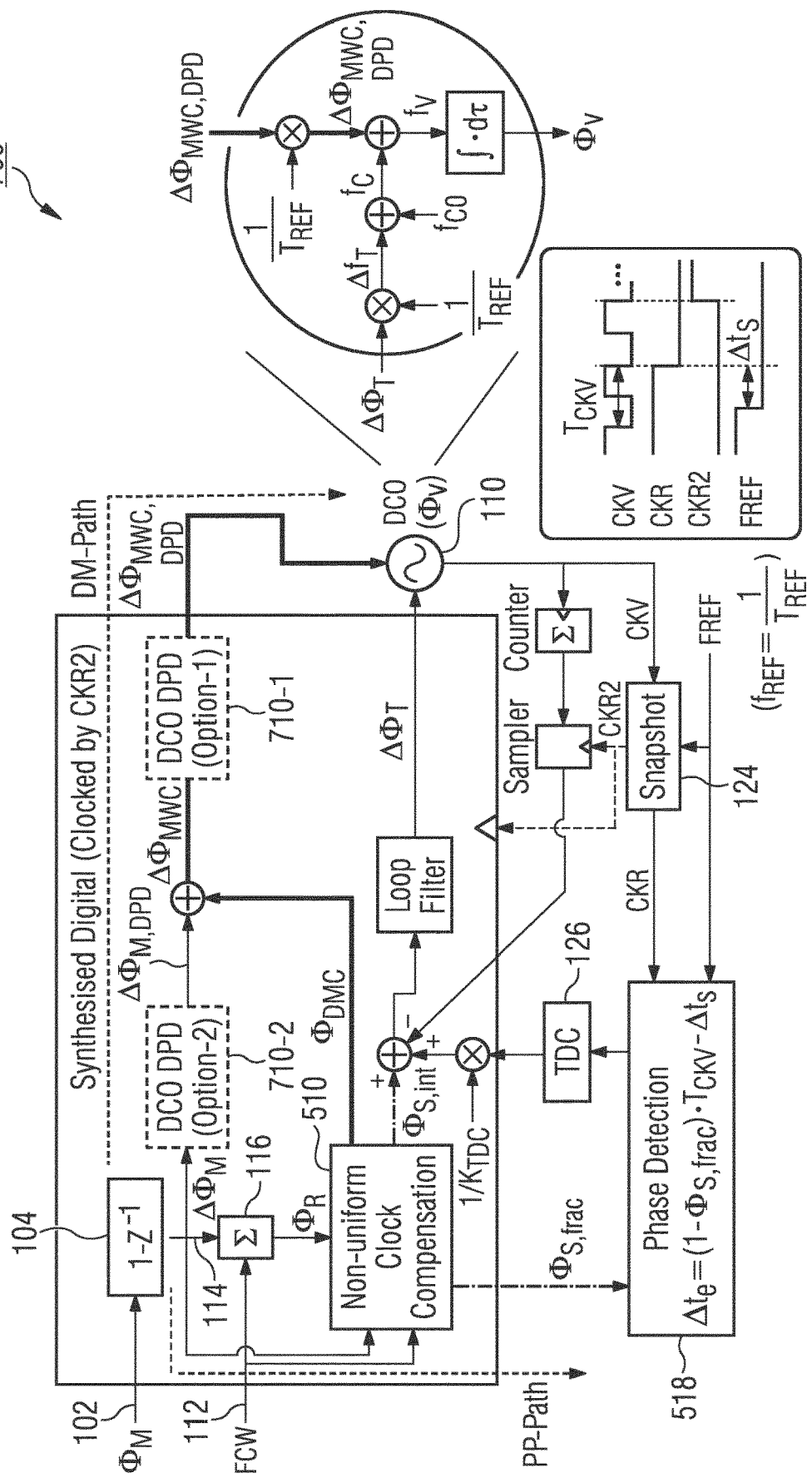
FIGS. 7, 8 show PLL-based phase modulators with NUCC and DCO nonlinearity digital pre-distortion.

FIG. 7 shows a system with both the NUCC and the DCO DPD. There are two possible positions to add DPD block 710. DPD block 710-1 of option-1 is configured to pre-distort the phase signal $\Delta\phi_{MWC}$ in the DM-path after the DM-path compensation. This may be the most accurate way but may also introduce additional latency on $\phi_{DMC}$.

Option 2 (DPD block 710-2) does not include $\phi_{DMC}$ in the DCO DPD, thus, introducing less latency to $\phi_{DMC}$ at the cost of accuracy. However, this is typically a favourable trade-off, since $\phi_{DMC}$ needs to arrive at the DCO within one clock cycle and longer latency due to the DPD may degrade the compensation performance. Furthermore, $\phi_{DMC}$ is relatively small. Excluding it from the DPD typically introduces negligible errors.

Figure 8:
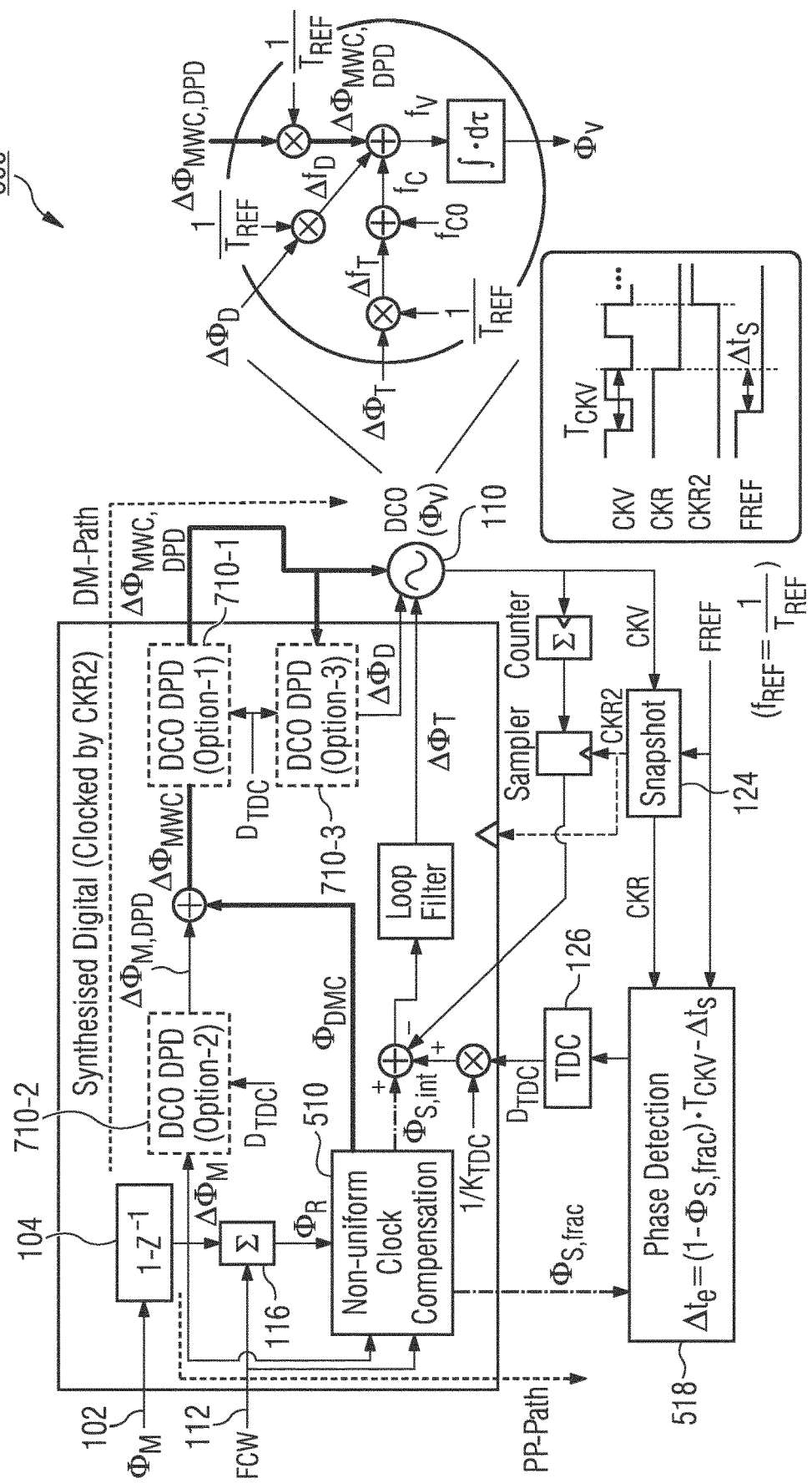

FIG. 8 shows a further option for the DCO DPD. Unlike options 1 and 2, option 3 (DPD block 710-3) may have the advantage that it does not increase the loop latency since its output is fed into the DCO 110 in parallel with the signal path. Furthermore, it can be seen that the compensation of option 3 may be fed via a separate DCO bank, but it could also be added back to the modulation path or to the tracking path and feed it into the DCO via the respective DCO control bank. Also, all three DPD options now also have an input from the TDC output. This allows each DPD option to also "track" and compensate dynamic effects (e.g., transient effects of switching operations) and to compensate, not only static ones as before. In the system, each option could individually take on the full DPD, or one could have multiple options to share certain tasks.

Embodiments of the present disclosure may improve the EVM to a level lower than approximately $$20\log_{10}\left(\frac{1}{FCW}\right) = 20\log_{10}\left(\frac{f_{REF}}{f_c}\right) = 20\log_{10}\left(\frac{f_{REF}}{N \cdot f_{c,ext}}\right),$$

N being the frequency divider between an internal DCO rate $f_c$ and the desired external carrier frequency $f_{c,ext}$. Because the variation of $T_{acc}$ and $T_{update}$ are within one $T_{CKV}$ cycle, which is around $$\frac{1}{FCW}$$

of $T_{REF}$. Therefore,
if these variations are not compensated, a distortion level around $$20\log_{10}\left(\frac{1}{FCW}\right)$$

below the signal may always be present.

For $f_{c,ext}=1$ GHZ, $f_{REF}=40$ MHz and N=4, embodiments of the present disclosure may have a residual error of <40 dB. This is of interest for modulation orders ≥1 k QAM, especially if some implementation margin shall be considered (e.g., all components should provide an error floor below the requirements, since all system errors will be summed-up for the total error observed at the output).

802.11ac (Wi-Fi 5) supports up to 256-QAM where 8 bits of data are encoded per symbol
       EVM <−30 dB
   802.11ax (Wi-Fi 6) supports up to 1024-QAM, where 10 bits of data are encoded per symbol
       EVM <−35 dB
   802.11be introduces 4096-QAM modulation with 12 bits of data per symbol
       EVM <−38 dB Note that the present technology can also be configured as described below.

Example 1 is a PLL circuit for generating a modulated carrier signal. The PLL circuit comprises a controlled oscillator configured to generate a controlled oscillator output signal CKV as the modulated carrier signal. A first input is configured to receive a desired phase change as a modulation signal at an n-th cycle of a non-uniform clock derived from the controlled oscillator output signal and a uniform reference clock. A first path for the desired phase change leads to the controlled oscillator to change its oscillation frequency based on the desired phase change. A second input configured to receive a frequency control word (FCW) at the n-th cycle of the non-uniform clock. The frequency control word (FCW) is a ratio of a desired carrier frequency of the carrier signal and a frequency of the uniform reference clock. A second path for the desired phase change leads to a frequency control word accumulator configured to accumulate the desired phase change and the FCW to generate a first phase prediction of the controlled oscillator's output phase at the (n+1)-th cycle of the non-uniform clock. A non-uniform clock compensation circuit is configured to recursively calculate, using the desired phase change, the frequency control word FCW and the first phase prediction, a non-uniform clock compensation value for the desired phase change on the first path and/or a second phase prediction of the controlled oscillator's output phase at the (n+1)-th cycle of the uniform reference clock. A phase detector is configured to estimate an error between the second phase prediction and an instantaneous time offset between the uniform reference clock and the controlled oscillator output signal and to generate a control signal for the controlled oscillator based on the estimated error.

In Example 2, the controlled oscillator output signal and the uniform reference clock of Example 1 have different respective frequencies and are asynchronous signals.

In Example 3, the non-uniform clock and the uniform reference clock of Examples 1 and 2 have equal respective average frequencies and instantaneous periods and start points of the non-uniform clock relative to the uniform reference clock vary from cycle to cycle.

In Example 4, the non-uniform clock of any one of Examples 1 to 3 is phase aligned with the controlled oscillator's output signal.

In Example 5, the first input of any one of Examples 1 to 4 is configured to receive a desired modulation phase for the modulated carrier signal at the n-th cycle of the non-uniform clock. The PLL circuit further comprises a differentiator circuit configured to differentiate the desired modulation phase to generate the desired phase change at the n-th cycle of the non-uniform clock.

In Example 6, the phase detector of any one of Examples 1 to 5 is configured to estimate the error between a predicted time difference between two nearest falling/rising edges of the uniform reference clock and the controlled oscillator's output signal and a measured time difference between two nearest falling/rising edges of the uniform reference clock and the DCO output signal.

In Example 7, the non-uniform clock compensation circuit of any one of Examples 1 to 6 is configured to calculate the non-uniform clock compensation value for the n-th non-uniform clock cycle based on the desired phase change of the (n−1)-th non-uniform clock cycle, an instantaneous period of the n-th non-uniform clock cycle, and a period of the uniform reference clock.

In Example 8, the non-uniform clock compensation circuit of any one of Examples 1 to 7 is configured to calculate the non-uniform clock compensation value ($\phi_{DMC}[n]$) for the n-th non-uniform clock cycle based on the second phase prediction ($\phi_S[n-2]$) of the controlled oscillator's output phase for the (n−1)-th uniform reference clock (FREF) cycle, the second phase prediction ($\phi_S[n-1]$) of the DCO's output phase for the n-th uniform reference clock (FREF) cycle, the frequency control word FCW; and the desired phase change ($\Delta\phi_M[n-1]$) of the (n−1)-th non-uniform clock (CKR2) cycle.

In Example 9, the non-uniform clock compensation circuit of any one of Examples 1 to 8 is configured to calculate the non-uniform clock compensation value ($\phi_{DMC}[n]$) for the n-th non-uniform clock (CKR2) cycle based on $$\phi_{DMC}[n] = \frac{\phi_{S,frac}[n-1] - \phi_{S,frac}[n-2]}{FCW} \cdot \Delta\phi_M[n-1],$$

wherein $\phi_{S,frac}[\cdot]$ denotes a fractional part of second phase prediction $\phi_S[\square]$ used to track the phase of the modulated carrier signal when the PLL circuit operates in a locked state.

In Example 10, the non-uniform clock compensation circuit of any one of Examples 1 to 9 is configured to calculate the second phase prediction ($\phi_S[n]$) of the DCO's output phase for the (n+1)-th uniform reference clock (FREF) cycle based on the first phase prediction ($\phi_R[n]$), the desired phase change ($\Delta\phi_M[n]$), the non-uniform clock compensation value ($\phi_{DMC}[n]$), a period ($T_{REF}$) of the uniform reference clock, and a non-uniform delay ($T_{update}[n]$) between an edge of the n-th uniform reference clock (FREF) cycle and an edge of the (n+1)-th non-uniform clock (CKR2) cycle plus a constant analog circuit delay ($D_{ana}$).

In Example 11, the non-uniform clock compensation circuit of Example 10 is configured to calculate the second phase prediction ($\phi_S[n]$) of the DCO's output phase for the (n+1)-th uniform reference clock (FREF) cycle based on $$\phi_S[n] = \phi_R[n] - \frac{T_{update[n]}}{T_{REF}} \cdot (\Delta\phi_M[n] + \phi_{DMC}[n]).$$

In Example 12, the non-uniform clock compensation circuit of Example 10 or 11 is configured to calculate the second phase prediction ($\phi_S[n]$) of the DCO's output phase for the (n+1)-th uniform reference clock (FREF) cycle based on $$\phi_S[n] \approx \phi_R[n] - \left[\left(\frac{2}{FCW} + \frac{D_{ana}}{T_{REF}}\right) - \frac{\phi_{S,frac}[n-1]}{FCW}\right] \cdot (\Delta\phi_M[n]),$$

wherein $\phi_{S,frac}[\cdot]$ denotes a fractional part of $\phi_S[\cdot]$ used to track the phase of the modulated carrier signal when the PLL circuit operates in a locked state.

Example 13 is a polar transmitter comprising a PLL circuit of any one of Examples 1 to 12.

Example 14 is a method for generating a modulated carrier signal. The method includes providing a controlled oscillator configured to generate a controlled oscillator output signal (CKV) as the modulated carrier signal. The method includes receiving a desired phase change ($\Delta\phi_M[n]$) as a modulation signal at an n-th cycle of a non-uniform clock (CKR2) derived from the controlled oscillator output signal (CKV) and a uniform reference clock (FREF) of a PLL circuit. The method includes providing the desired phase change ($\Delta\phi_M[n]$) to the controlled oscillator to change its oscillation frequency based on the desired phase change ($\Delta\phi_M[n]$). The method includes receiving a frequency control word (FCW) at the n-th cycle of the non-uniform clock (CKR2), the frequency control word (FCW) being a ratio of a desired carrier frequency ($f_c$) of the carrier signal and a frequency ($f_{REF}$) of the uniform reference clock. The method includes providing the desired phase change ($\Delta\phi_M$) to a frequency control word accumulator configured to accumulate the desired phase change ($\Delta\phi_M[n]$) and the FCW to generate a first phase prediction ($\Delta_R[n]$) of the controlled oscillator's output phase at the (n+1)-th cycle of the non-uniform clock (CKR2). The method includes recursively calculating, using the desired phase change ($\Delta\phi_M[n]$), the frequency control word FCW, and the first phase prediction ($\Delta_R[n]$), a non-uniform clock compensation value ($\phi_{DMC}[n]$) for the desired phase change $\Delta\phi_M[n]$ on the first path and/or a second phase prediction ($\phi_S[n]$) of the controlled oscillator's output phase at the (n+1) cycle of the uniform reference clock (FREF). The method includes estimating an error between the second phase prediction ($\phi_S[n]$) and an instantaneous time offset ($\Delta t_S$) between the uniform reference clock (FREF) and the controlled oscillator output signal (CKV) and generating a control signal for the controlled oscillator based on the estimated error.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps,-functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

Definition of Symbols $\Delta t_S$ the instantaneous time offset between the falling edges FREF and subsequent CKV $T_{REF}$ the period of FREF, which is the frequency reference for PLL $T_{CKV}$ the period of CKV, which is the output of DCO $T_{acc}$ the duration between $\Delta f_M$ update. The DCO keeps the frequency change of for the duration of $T_{acc}$ to accumulate the desired phase change $T_{acc,S}$ the duration between $\Delta f_M$ update and FREF falling. During this period, the phase of $\phi'_V$ changes from $\phi'_{R,A}$ to $\phi'_{S,A}$ $T_{update}$ the time offset between FREF falling and $\Delta f_M$ update $D_{ana}$ the delay between CKR2 and $\Delta f_M$ or $\Delta f_{MWC}$ settling (Caution: all the phases here have been normalized with $$\frac{1}{2\pi})$$

$\phi_V$ output phase of DCO $\phi_S$ prediction for the $\phi_V$ sampled by FREF falling edge $\phi_R$ prediction for the $\phi_V$ at the moment of $\Delta f_M$ update if no errors caused by the non-uniform digital clock $\phi'_V$ the $\phi_V$ excluding the phase of carrier $\Delta\phi'_V$ the phase change of $\phi'_v$ during $T_{acc}$ (the duration between $\Delta f_M$ update)

$\phi'_s$ the $\phi_S$ excluding the predicted phase of carrier $\phi'_R$ the $\phi_R$ excluding the predicted phase of carrier $\phi_{DMC}$ the phase of DM-Path Compensation $\phi_{DMC,e}$ the error between the desired $\phi_{DMC}$ and the achieved value $\phi_M$ the desired phase for modulation $\Delta\phi_M$ the change of $\phi_M$ during each FREF/CKR2 cycles $\Delta\phi_T$ the output of loop filter to help DCO track $f_c$ $\Delta\phi'_{V,e}$ the error between the desired phase $\Delta\phi_M$ and the accumulated phase on DCO $\Delta f_m$ the frequency change on DCO to achieve phase change of $\Delta\phi_M$ in each FREF/CKR2 cycles $\Delta f_{DMC}$ the frequency change on DCO to compensate $\phi_{DMC}$ $\Delta f_{MWC}$ the frequency change $\Delta f_M$ with compensation $\Delta f_{DMC}$ $f_V$ instantaneous frequency of DCO $f_C$ target carrier frequency of the phase modulator $f_{CO}$ intrinsic frequency of DCO around the $f_c$. It should be corrected by the $f_T$ to reach $f_c$ $\Delta f_T$ the frequency change of DCO in response to $\Delta\phi_T$ $f_{REF}$ frequency of FREF

The invention claimed is:

1. A phased locked loop, PLL, circuit for generating a modulated carrier signal, the PLL circuit comprising
   a controlled oscillator configured to generate a controlled oscillator output signal as the modulated carrier signal;
   a first input configured to receive a desired phase change as a modulation signal at an n-th cycle of a non-uniform clock derived from the controlled oscillator output signal and a uniform reference clock;
   a first path for the desired phase change to the controlled oscillator to change its oscillation frequency based on the desired phase change;
   a second input configured to receive a frequency control word at the n-th cycle of the non-uniform clock, the frequency control word being a ratio of a desired carrier frequency of the carrier signal and a frequency of the uniform reference clock;
   a second path for the desired phase change to a frequency control word accumulator configured to accumulate the desired phase change and the FCW to generate a first phase prediction of the controlled oscillator's output phase at the (n+1)-th cycle of the non-uniform clock;
   a non-uniform clock compensation circuit configured to recursively calculate, using the desired phase change, the frequency control word, and the first phase prediction, a non-uniform clock compensation value for the desired phase change on the first path and/or a second phase prediction of the controlled oscillator's output phase at the (n+1)-th cycle of the uniform reference clock;
   a phase detector configured to estimate an error between the second phase prediction and an instantaneous time offset between the uniform reference clock and the controlled oscillator output signal and to generate a control signal for the controlled oscillator based on the estimated error.

2. The PLL circuit of claim 1, wherein the controlled oscillator output signal and the uniform reference clock have different respective frequencies and are asynchronous signals.

3. The PLL circuit of claim 1, wherein the non-uniform clock and the uniform reference clock have equal respective average frequencies, and wherein instantaneous periods and start points of the non-uniform clock relative to the uniform reference clock vary from cycle to cycle.

4. The PLL circuit of claim 1, wherein the non-uniform clock is phase aligned with the controlled oscillator output signal.

5. The PLL circuit of claim 1, wherein the first input is configured to receive a desired modulation phase for the modulated carrier signal at the n-th cycle of the non-uniform clock, and wherein the PLL circuit further comprises
   a differentiator circuit configured to differentiate the desired modulation phase to generate the desired phase change at the n-th cycle of the non-uniform clock.

6. The PLL circuit of claim 1, wherein the phase detector is configured to estimate the error between a predicted time difference between two nearest falling/rising edges of the uniform reference clock and the controlled oscillator output signal and a measured time difference between two nearest falling/rising edges of the uniform reference clock and the controlled oscillator output signal.

7. The PLL circuit of claim 1, wherein the non-uniform clock compensation circuit is configured to calculate the non-uniform clock compensation value for the n-th non-uniform clock cycle based on the desired phase change of the (n−1)-th non-uniform clock cycle, an instantaneous period of the n-th non-uniform clock cycle, and a period of the uniform reference clock.

8. The PLL circuit of claim 1, wherein the non-uniform clock compensation circuit is configured to calculate the non-uniform clock compensation value for the n-th non-uniform clock cycle based on the second phase prediction of the controlled oscillator's output phase for the (n−1)-th uniform reference clock cycle, the second phase prediction of the controlled oscillator's output phase for the n-th uniform reference clock cycle, the frequency control word; and the desired phase change of the (n−1)-th non-uniform clock cycle.

9. The PLL circuit of claim 1, wherein the non-uniform clock compensation circuit is configured to calculate the non-uniform clock compensation value ($\phi_{DMC}[n]$) for the n-th non-uniform clock (CKR2) cycle based on $$\phi_{DMC}[n] = \frac{\phi_{S,frac}[n-1] - \phi_{S,frac}[n-2]}{FCW} \cdot \Delta\phi_M[n-1],$$

wherein $\phi_{S,frac}[\cdot]$ denotes a fractional part of the second phase prediction $\phi_S[\cdot]$ used to track the phase of the modulated carrier signal when the PLL circuit operates in a locked state.

10. The PLL circuit of claim 1, wherein the non-uniform clock compensation circuit is configured to calculate the second phase prediction of the controlled oscillator's output phase for the (n+1)-th uniform reference clock cycle based on the first phase prediction ($\phi_R[n]$), the desired phase change ($\Delta\phi_M[n]$), the non-uniform clock compensation value ($\phi_{DMC}[n]$), a period ($T_{REF}$) of the uniform reference clock, and a non-uniform delay ($T_{update}[n]$) between an edge of the n-th uniform reference clock cycle and an edge of the (n+1)-th non-uniform clock cycle plus a constant analog circuit delay ($D_{ana}$).

11. The PLL circuit of claim 10, wherein the non-uniform clock compensation circuit is configured to calculate the second phase prediction ($\phi_S[n]$) of the controlled oscillator's output phase for the (n+1)-th uniform reference clock (FREF) cycle based on $$\phi_S[n] = \phi_R[n] - \frac{T_{update[n]}}{T_{REF}} \cdot (\Delta\phi_M[n] + \phi_{DMC}[n]).$$

12. The PLL circuit of claim 10, wherein the non-uniform clock compensation circuit is configured to calculate the second phase prediction ($\phi_S[n]$) of the controlled oscillator's output phase for the (n+1)-th uniform reference clock (FREF) cycle based on $$\phi_S[n] \approx \phi_R[n] - \left[ \left( \frac{2}{FCW} + \frac{D_{ana}}{T_{REF}} \right) - \frac{\phi_{S,frac}[n-1]}{FCW} \right] \cdot (\Delta\phi_M[n]),$$

wherein $\phi_{S,frac}[\cdot]$ denotes a fractional part of $\phi_S[\cdot]$ used to track the phase of the modulated carrier signal when the PLL circuit operates in a locked state.

13. A polar transmitter comprising the PLL circuit of claim 1.

14. A method for generating a modulated carrier signal, the method comprising
providing a controlled oscillator configured to generate a controlled oscillator output signal (CKV) as the modulated carrier signal;
receiving a desired phase change ($\Delta\phi_M[n]$) as a modulation signal at an n-th cycle of a non-uniform clock (CKR2) derived from the controlled oscillator output signal (CKV) and a uniform reference clock (FREF) of a PLL circuit;
providing the desired phase change ($\Delta\phi_M[n]$) to the controlled oscillator to change its oscillation frequency based on the desired phase change ($\Delta\phi_M[n]$);
receiving a frequency control word (FCW) at the n-th cycle of the non-uniform clock (CKR2), the frequency control word (FCW) being a ratio of a desired carrier frequency ($f_c$) of the carrier signal and a frequency ($f_{REF}$) of the uniform reference clock;
providing the desired phase change ($\Delta\phi_M$) to a frequency control word accumulator configured to accumulate the desired phase change ($\Delta\phi_M[n]$) and the FCW to generate a first phase prediction ($\phi_R[n]$) of the controlled oscillator's output phase at the (n+1)-th cycle of the non-uniform clock (CKR2);
recursively calculating, using the desired phase change ($\Delta\phi_M[n]$), the frequency control word FCW, and the first phase prediction ($\phi_R[n]$), a non-uniform clock compensation value ($\phi_{DMC}[n]$) for the desired phase change $\Delta\phi_M[n]$ on the first path and/or a second phase prediction ($\phi_S[n]$) of the controlled oscillator's output phase at the (n+1)-th cycle of the uniform reference clock (FREF); and
estimating an error between the second phase prediction ($\phi_S[n]$) and an instantaneous time offset ($\Delta t_S$) between the uniform reference clock (FREF) and the controlled oscillator output signal (CKV) and generating a control signal for the controlled oscillator based on the estimated error.

* * * * *